United States Patent [19]

Jambotkar

[11] 4,378,627

[45] Apr. 5, 1983

[54] SELF-ALIGNED METAL PROCESS FOR FIELD EFFECT TRANSISTOR INTEGRATED CIRCUITS USING POLYCRYSTALLINE SILICON GATE ELECTRODES

[75] Inventor: Chakrapani G. Jambotkar, Hopewell Junction, N.Y.

[73] Assignee: International Business Machines Corporation, Armonk, N.Y.

[21] Appl. No.: 167,172

[22] Filed: Jul. 8, 1980

[51] Int. Cl.$^3$ .................... H01L 21/302; H01L 21/31
[52] U.S. Cl. .................................. 29/571; 29/577 C;
29/578; 29/580; 148/1.5; 148/174; 148/175;
148/187; 156/643; 156/653; 156/657; 156/662;
357/23; 357/59
[58] Field of Search ..................... 29/571, 577 C, 578,
29/580; 148/1.5, 175, 187, 174; 156/643, 653,
657, 662; 357/23, 59

[56] References Cited

U.S. PATENT DOCUMENTS

| | | | |
|---|---|---|---|
| 3,750,268 | 8/1973 | Wang | 29/571 |
| 3,984,822 | 10/1976 | Simko et al. | 340/173 R |
| 4,083,098 | 4/1978 | Nicholas | 29/578 |
| 4,209,349 | 6/1980 | Ho et al. | 148/187 |
| 4,234,362 | 11/1980 | Riseman | 148/187 |
| 4,236,294 | 12/1980 | Anantha et al. | 29/578 |
| 4,252,582 | 2/1981 | Anantha et al. | 148/175 |
| 4,256,514 | 3/1981 | Pogge | 148/1.5 |
| 4,287,661 | 9/1981 | Stoffel | 156/643 X |
| 4,318,751 | 3/1982 | Horng | 148/1.5 |
| 4,322,883 | 4/1982 | Abbas et al. | 29/578 |

FOREIGN PATENT DOCUMENTS 2003660 3/1979 United Kingdom .

OTHER PUBLICATIONS

Critchlow, D. L., "High Speed Mosfet . . . Lithography", Computer, vol. 9, No. 2, Feb. 1976, pp. 31–37.
Pogge, H. B., "Narrow Line Widths Masking Method", I.B.M. Tech. Discl. Bull., vol. 19, No. 6, Nov. 1976, pp. 2057–2058.
Abbas et al., "Extending the Minimal Dimensions of . . . Processing", I.B.M. Tech. Discl. Bull., vol. 20, No. 4, Sep. 1977, pp. 1376–1378.
Jackson et al., "Novel Submicron Fabrication Technique", Semiconductor International, Mar. 1980, pp. 77–83.

Primary Examiner—L. Dewayne Rutledge
Assistant Examiner—William G. Saba
Attorney, Agent, or Firm—George O. Saile

[57] ABSTRACT

A process is described which achieves self-aligned metal to silicon contacts and submicron contact-to-contact and metal-to-metal spacing for field effect transistor integrated circuits. The method for forming integrated circuits with this structure includes forming openings in a first polycrystalline silicon layer overlying an insulator by reactive ion etching which results in the structure having substantially horizontal surfaces and substantially vertical surfaces. The openings are in those areas designated to be the gate regions of the field effect transistors. A second insulating layer is then formed on both the substantially horizontal surfaces and substantially vertical surfaces. Reactive ion etching of this second insulating layer substantially removes the horizontal layers and provides a narrow dimensioned dielectric pattern of regions on the major surface of the silicon body. The gate dielectric is formed hereat. A second polycrystalline silicon gate electrode is formed over the gate dielectric and between certain of said narrow dimensioned regions. The remaining first polycrystalline silicon layer is then removed by etching to leave the narrow dimensioned regions on the major surface of the silicon body. A conductive layer is blanket deposited over the narrow dimensioned regions and areas in between to make contact to source/drain PN regions. A blanket layer of a plastic material is used to planarize the surface by reactive ion etching the plastic material and the conductive layer until the tops of the narrow dimensioned regions are reached. The plastic material is then removed leaving the structure of patterns of metal or polycrystalline silicon filling the regions between the pattern of dielectric material having a thickness dimension in the order of a micron or less. The source and drain electrodes are thusly formed.

8 Claims, 20 Drawing Figures

SELF-ALIGNED METAL PROCESS FOR FIELD EFFECT TRANSISTOR INTEGRATED CIRCUITS USING POLYCRYSTALLINE SILICON GATE ELECTRODES

DESCRIPTION

TECHNICAL FIELD

The invention relates to methods and resulting structures for manufacturing field effect transistor integrated semiconductor devices and, more particularly, to a self-aligned metal process which achieves a polycrystalline silicon gate electrode with self-aligned metal-to-silicon contacts and submicron contact-to-contact and metal-to-metal spacing wherein the insulation between the contacts is a pattern of dielectric material having a thickness dimension in the order of a micron or less.

CROSS REFERENCES TO RELATED PATENT APPLICATIONS (1) Patent Application Ser. No. 167,184 filed like date entitled "Self-Aligned Metal Process for Integrated Circuit Metallization" by G. R. Goth, I. E. Magdo, and S. D. Malaviya.

(2) Patent Application Ser. No. 167,253 filed like date entitled "Self-Aligned Metal Process for Field Effect Transistor Integrated Circuits" by S. A. Abbas and I. E. Magdo.

(3) Patent Application Ser. No. 167,173 now U.S. Pat. No. 4,322,883 filed like date entitled "Self-Aligned Metal Process for Integrated Injection Logic Integrated Circuits" by S. A. Abbas and I. E. Magdo.

BACKGROUND ART

Semiconductor integrated circuits have substantially increased in density in the past decade. However, there is an increasing demand for higher levels of integration, higher switching speeds and smaller devices for new applications, such as microprocessors and minicomputers. The field effect transistor technology is dominant in main memory and lower performance logic and arrays because of its higher circuit density and simpler processing as compared with bipolar technology.

A very active area in the semiconductor fabrication technology has been the generation and application of fine lines and line separations in the lithographic technology. Light had been used almost exclusively until the recent past in the lithographic process for exposing a photosensitive film. However, optical resolution limits make further advances in finer line widths and line separations much more difficult. The most important and versatile among the technologies for the future reduction in line widths and separations are electron beam and X-ray exposure processes. The lithography problems and their possible solutions are discussed in greater detail by D. L. Critchlow in the publication entitled "High Speed MOSFET Circuits Using Advanced Lithography", published in the *Computer*, Vol. 9, No. 2, February 1976, pp. 31 through 37. In that publication the substantial equipment costs and complexities of X-ray and electron beam lithography are described.

There have been alternative efforts to obtain narrow line widths and separations in the range of one micrometer or less by extending standard photolithography techniques and avoiding the need for the more expensive and complex techniques, such as electron beam or X-ray lithography. One such technique is described by H. B. Pogge in IBM Technical Disclosure Bulletin, November 1976, Vol. No. 6, entitled "Narrow Line Widths Masking Method". This method involves the use of a porous silicon followed by oxidation of porous silicon. Another technique is described by S. A. Abbas, et al, IBM Technical Disclosure Bulletin Vol. 20, No. 4, September 1977, pp. 1376 through 1378. This TDB describes the use of polycrystalline silicon masking layers which are made into masks by first using an intermediate mask of oxidation blocking material, such as silicon nitride in the formation of the polycrystalline silicon. Line dimensions below about two micrometers may be obtained by this technique. T. N. Jackson, et al, described "A Novel Sub-micron Fabrication Technique" in the March 1980 publication *Semiconductor International*, pp. 77 through 83. This method for producing sub-micron line widths and devices does not require electron beam lithography but used a selective edge plating technique. The U.K. Pat. No. 2,003,660 published Mar. 14, 1979 describes a method for depositing an area of metal, for example metal on a substrate and forming narrow metal stripes by using a unidirectional plasma etching technique. K. H. Nicholas, U.S. Pat No. 4,083,098 describes a method of making a plurality of closely spaced, but air isolated, conductive layers on an insulated substrate. He suggests no ohmic connections to the silicon body under the insulator supporting his conductive layers. The above techniques do show ways of forming narrow lines on substrates but lack an overall solution for their successful use in the manufacture of semiconductor devices, because it is unclear how they will be used to contact actual device elements within the semiconductor substrate in an accurate and effective manner. Further, there are problems of planarity of the first level metallurgy and adequate conductivity of the metallurgy at that level.

The patent application of H. B. Pogge, Ser. No. 957,604 filed Nov. 3, 1978, entitled "Method for Forming a Narrow Dimensioned Region on A Body", now U.S. Pat. No. 4,256,514 and the patent application of J. Riseman Ser. No. 957,606 filed Nov. 3, 1978, entitled "Method for Forming An Insulator Between Layers of Conductive Material", now U.S. Pat. No. 4,234,362 describe techniques for forming narrow dimensioned, for example submicron regions on a semiconductor body that involves forming on the silicon body regions having substantially horizontal surfaces and substantially vertical surfaces. A layer of a very narrow dimension is formed both on the substantially horizontal and substantially vertical surfaces. Reactive ion etching is applied to the layer to substantially remove the horizontal layer while leaving the vertical layer substantially intact. The vertical layer dimension is adjusted depending upon the original thickness of the layer applied. The patent applications more importantly describe techniques for using this narrowed dimensioned region in a semiconductor device fabrication process for various types of integrated circuit structures such as field effect devices.

A major problem in very dense integrated circuits is the electrical contacts to the various elements and devices in the semiconductor integrated circuits. A problem involves the conductivity of the metallurgy at the various levels as the device density increases. In recent times, solutions to these problems have taken the direction of the use of highly doped polycrystalline silicon as conductive layers such as shown in R. C. Wang, U.S.

Pat. No. 3,750,268, issued Aug. 7, 1973 and R. T. Simko, et al U.S. Pat. No. 3,984,822, issued Oct. 5, 1976. However, as the density of devices has increased, there still remain problems involving isolation between devices, conductivity particularly at the first level of metallurgy contacting the semiconductor devices, and alignment of the levels of metallurgy to the device elements in the semiconductor integrated circuit.

In the usual methods for forming double polycrystalline silicon multilayer structures, silicon dioxide is used as the insulator between the layers. The silicon dioxide thickness between two polycrystalline layers is normally directly related to the thickness of the silicon gate oxide where a FET type device is being made. The usual thermal oxidation techniques are used to form the silicon dioxide layer.

It is the object of this invention to provide methods for forming an insulator of any desired thickness between the conductive layers, which are polycrystalline silicon for the gate electrodes and metal for other purposes, and, in particular, on the vertical regions between the layers of conductive material which are the electrical contacts to elements of field effect transistor integrated circuits.

The method for forming FET integrated circuits having a pattern of narrow dimensioned dielectric regions on the body of a monocrystalline semiconductor, preferably silicon, involves providing the silicon body and forming a first insulating layer on a major surface of the body. A highly doped polycrystalline silicon layer and a silicon nitride layer are then successively formed on the first insulating layer. Openings in the silicon nitride and polycrystalline layers are made using directional reactive ion etching which results in a structure having substantially horizontal surfaces and substantially vertical surfaces. The openings are in those areas designated to be the gate regions of the field effect transistors in the integrated circuit. A second insulating layer is then deposited on both said substantially horizontal surfaces and said substantially vertical surfaces. The thickness of the second insulator layer is the desired thickness of the narrowed dimensioned dielectric regions to be ultimately formed on the semiconductor, or preferably silicon body. The structure is placed in a vertically directional reactive ion etching ambient where the second insulating layer is substantially removed from the horizontal surfaces. This directional etching has no significant effect on the insulating layer on the vertical regions of the polycrystalline silicon. The semiconductor body is subjected to a heat cycle to suitably drive down the dopant from the polycrystalline silicon layer into the semiconductor body in intimate contact with the polycrystalline silicon layer. The gate dielectric layer is formed. A second doped layer of polycrystalline layer is obtained and a plastic layer, such as polyimide or photoresist, is coated over it. The second polycrystalline silicon layer and the plastic layer are etched at practically the same etch rate using reactive ion etching until the silicon nitride layer is exposed. Patterns are formed in the remaining second polycrystalline layer, and a silicon dioxide layer is thermally grown at the surface of the second polycrystalline silicon layer. The exposed silicon nitride and first polycrystalline silicon regions are then removed by etching to leave the self-standing narrow dimensioned dielectric regions on the silicon body surface. Using a non-critical mask, portions of the silicon dioxide layer covering the second polycrystalline silicon and portions of the narrow dimensioned dielectric regions are removed in areas away from the FET areas. A conductive layer of one or more wide variety of possible materials is now deposited using a lift-off mask upon the narrow dimensioned regions and on the silicon body to make contact to source/drain PN regions. Where the conductive layer is formed upon bare silicon, ohmic contacts can be formed thereto. A plastic material, such as a polyimide or photoresist, is deposited over this conductive layer to planarize the surface thereof. The structure is then placed in a reactive ion etching ambient where the conductive layer is uniformly etched together with the plastic layer until the tops of the narrow dimensioned regions are reached. The remaining plastic material is then removed to thereby form the substantially planar conductive layer with narrow dimensioned dielectric isolation separating portions of the conductive layer from other portions of the conductive layer and the polycrystalline silicon gate electrode.

The method can be used to form a variety of field effect transistor products. These structures are formed by appropriate modifications of the method described in the preceding paragraph to form suitable PN junctions, gate dielectric and electrode structures, PN contact regions, together with openings to the semiconductor body which have these elements formed therein. Logic and memory field effect transistor integrated circuits may be formed according to these methods to provide the beneficial results of high density with suitable conductivity of the metallurgy layers and good planarity, with its attendant yield and reliability.

The method may be adapted to form a short channel field effect transistor integrated circuit. This structure includes a silicon body having a pattern of narrow dimensioned dielectric regions on a major surface of said body. A gate dielectric layer is located on the major surface between certain portions of the narrow dimensioned regions. PN junction source/drain regions are located directly below certain portions of the narrow dimensioned regions and associated with a short channel under said gate dielectric layer. Polycrystalline silicon gate electrodes are located on the surface of the gate dielectric layer between certain of the narrow dimensioned regions. Metal electrical contacts are made to the edges of said PN junction regions while filling the spaces between the remaining narrow dimensioned regions. These contacts are self-aligned to the narrow dimensioned regions and substantially planar with the tops of the narrow dimensioned regions.

DISCLOSURE OF THE INVENTION

Figure 1:
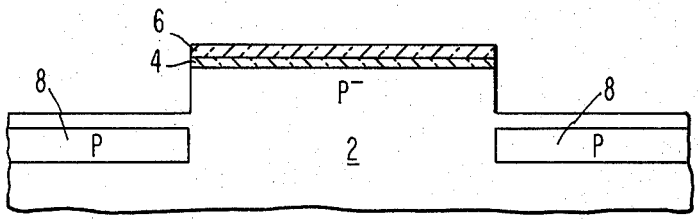
FIGS. 1 through 11 illustrate a first method embodiment for forming a field effect integrated circuit device according to the present invention.
Figure 2:
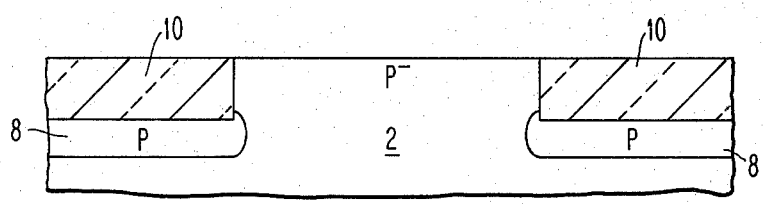

Referring now more particularly to FIGS. 1 through 11, there is illustrated a first embodiment for utilizing the self-aligned metal process to form field effect transistor integrated circuits. The process is illustrated to form N channel MOSFET field effect transistor integrated circuits. However, it would be obvious that P channel field effect transistors can alternatively be formed by simply reversing the polarities of the various elements of the transistors and associated regions. The FIG. 1 illustrates one small, greatly enlarged portion of a silicon body which will be used to form a very dense field effect transistor integrated circuit structure. A near-intrinsic P-substrate 2 having a resistivity of 20 to 100 ohm-cm is a preferred substrate for the process. P type substrate of monocrystalline silicon substrate having a 10-20 ohm-cm resistivity may alternatively be the basic foundation structure for the process. P+ substrates with low doped P epitaxy can also be utilized.

Figure 3:
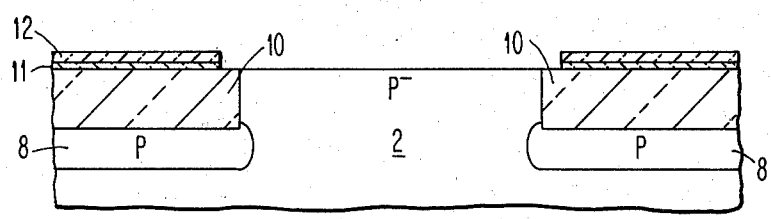
Figure 4:
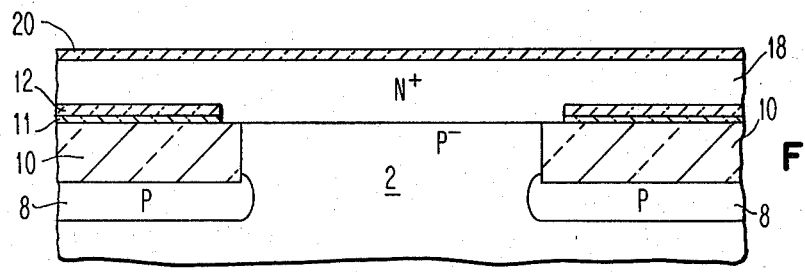

The first series of method steps involve the formation of isolation means for isolating regions of monocrystalline silicon from other regions of monocrystalline silicon in substrate 2. The isolation may preferably be partial dielectric isolation using materials such as silicon dioxide, glass, etc. The preferred pattern of partial dielectric isolation 10 define monocrystalline silicon surface regions wherein field effect devices will ultimately be formed. Underneath the dielectric isolation is a P ion implantation region 8 to prevent surface leakage at the interface between the substrate and the dielectric isolation. There are many ways in the art to form dielectric isolation regions of this type. It is preferred to use the process described in the Magdo et al patent application Ser. No. 150,609, filed June 7, 1971, or Peltzer U.S. Pat. No. 3,648,125. Alternatively, the process described in the J. A. Bondur et al U.S. Pat. No. 4,104,086 can be used. In the above patent application and patents the processes for forming partial dielectric isolation regions 10 are described in detail. However, the process briefly involves forming silicon dioxide layer 4 on the silicon body 2. A layer of silicon nitride 6 is formed thereover. The layers 4, 6 are removed by conventional lithography in areas designated to have dielectric isolation. The silicon body 2 is etched using the remaining layers 4, 6 as a mask. P region 8 is formed by ion implantation using boron as the impurity to form the FIG. 1 structure. The structure is placed in an oxidizing ambient until the silicon dioxide dielectric isolation regions 10 are formed. The layers 4, 6 are etched off to produce the FIG. 2 structure. Insulating layers of silicon dioxide 11 and silicon nitride 12 are formed over the body's surface. Conventional lithography and etching techniques are used to remove layers 11, 12 in the active device areas, as shown in FIG. 3.

A first insulating layer 11, 12 is shown to be composed of silicon dioxide and silicon nitride. The first insulating layer 11, 12 may be, however, a layer composed of silicon dioxide, silicon nitride, aluminum trioxide, or the like, or combinations of the foregoing. The layer may be thermally grown in oxygen or oxygen-water vapor ambient at a temperature of around 970° C. to form a thermal silicon dioxide layer. A second method for forming silicon dioxide involves the use of chemical vapor deposition process using $SiH_4$ and $O_2$ at about 450° C.; or $SiH_2Cl_2$ and $N_2O$ at a temperature of about 800° C. under atmospheric or low pressure conditions. The deposition of silicon nitride is usually formed by chemical vapor deposition using the following process conditions: $SiH_4$, $NH_3$ and $N_2$ carrier gas at a temperature of about 800° C. under atmospheric or low pressure conditions as described, for example, in the V. Y. Doo U.S. Pat. No. 4,089,992. The insulating layer 12 is of about 1500 Å thickness.

A coating 18 of polycrystalline silicon is now deposited over the entire wafer by using, for example, silane in a hydrogen ambient in a temperature range of about 500° to 1000° C. The operative thickness of the polycrystalline silicon is between about 7,000 to 12,000 Angstroms with 10,000 Angstroms preferred. Generally, it is desired that the first polysilicon layer be approximately equal to the metal thickness. If it is much higher, the studs protrude too much over the metal resulting in non-planarity of first level. If the studs are too low, planarization and the breaking of the metal is more difficult to achieve. The polycrystalline silicon layer is doped N+ type either in situ during deposition of the polycrystalline silicon layer or through ion implantation of an N+ type impurity subsequent to deposition of the polycrystalline silicon layer. Phosphorus is a suitable impurity for this doping. The polycrystalline silicon layer makes contact to the silicon body 2 in areas void of the first insulating layer 11, 12. A silicon nitride layer 20 which may be, for example, about 500 Angstroms in thickness is deposited by chemical vapor deposition according to the following conditions: by decomposing $SiH_4$ and $N_2$ at 800° to produce the FIG. 4 structure. Other suitable insulating layers or combination of layers can be substituted for the silicon nitride.

Standard photolithography and etching techniques may be utilized to form openings in this silicon nitride layer 20 over the areas designated to be gate regions of the integrated circuit. Using this silicon nitride mask the structure is placed in a reactive ion or plasma etching environment for a polycrystalline silicon having typically the conditions as follows: for example, $CF_4$/Argon, $Cl_2$/Argon or $CCl_4$/Argon, $SF_6$ or $SF_6+Cl_2$, RF parallel plate structure, about 10 microns pressure, 0.16 watts/cm² power density and 10 cc/min. flow rate and using the apparatus described in the Harvilchuck, et al patent application Ser. No. 594,413 filed July 9, 1975 and continuation patent application Ser. No. 822,775 filed Aug. 8, 1977. The reactive ion etching process is completed when it reaches the monocrystalline silicon body 2. The resulting structure has horizontal surfaces and vertical surfaces.

A conformal layer 26 is deposited on both the substantially horizontal surfaces and the substantial vertical surfaces (not shown). This conformal layer 26 is typically formed by chemical vapor deposition. This conformal layer must be, as formed, an electrical insulator or capable of being changed to an insulator. The layer 26 may be one of several insulating materials, such as silicon dioxide, silicon nitride, aluminum trioxide and combinations of these materials with polycrystalline silicon. The conformal layer 26 utilized in the present embodiment is silicon dioxide having a thickness of between about 3,000 to 10,000 Angstroms and preferably about 6,000 Angstroms.

Figure 5:
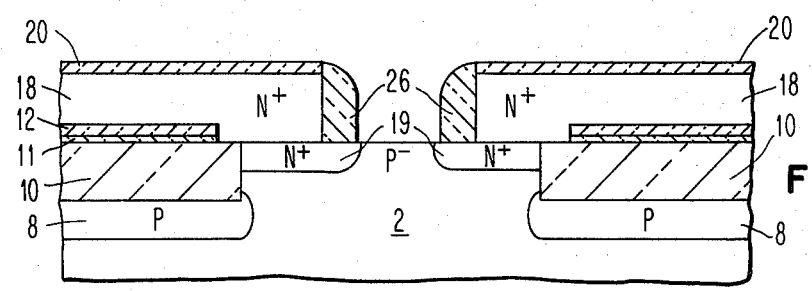

The structure is placed into a suitable reactive ion etching ambient for the material of the conformal layer 26. For example, in etching silicon dioxide, the conditions are such that an etch ratio of about 10 to 1 silicon dioxide to silicon is desirable. Overetching is needed to be sure all of the silicon dioxide is removed from the horizontal surfaces and/or an etched stop indicator is utilized. The reactive ion etching process substantially removes the horizontal portion of the layer 26 and provides the pattern of narrow dimensioned vertical regions 26 on the silicon body which is shown in FIG. 5. The source/drain N+ regions 19 are formed by outdiffusion from the first polycrystalline silicon layer 18. This is accomplished by subjecting the substrate to a typical heat cycle of approximately thirty minutes at about 1000° C.

Figure 6:
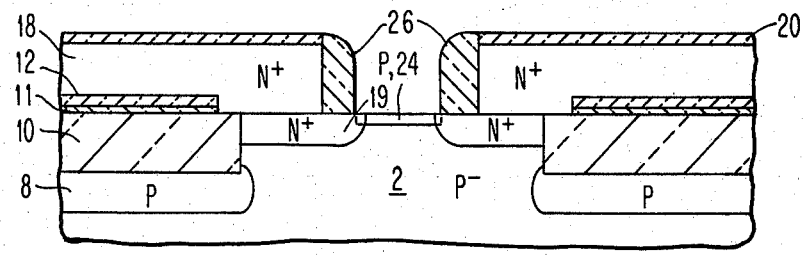

Referring now more particularly to FIG. 6, ion implantation of a suitable dosage of boron at low power causes the formation of P region 24 at the exposed silicon body's major surface between the certain narrow dimensioned regions 26. The P region 24 is the channel for the field effect transistor device being formed in the active region. The result of this process is shown in FIG. 6.

The structure of FIG. 6 is now subjected to thermal oxidation ambient so as to form the silicon dioxide gate dielectric. The thickness of the gate dielectric may be between about 200 to 500 Angstroms, and preferably is approximately 450 Angstroms.

Figure 7:
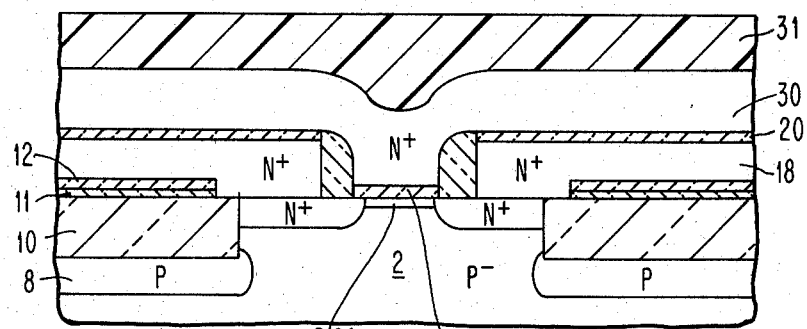
Figure 8:
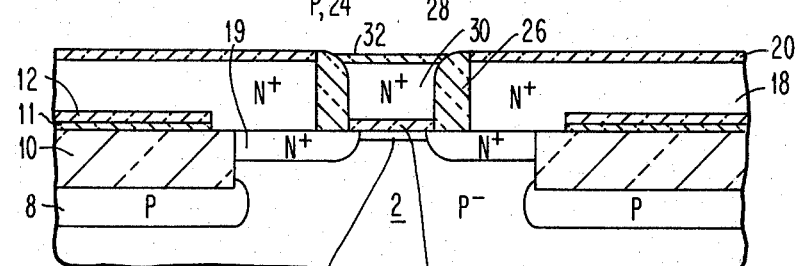
Figure 9:
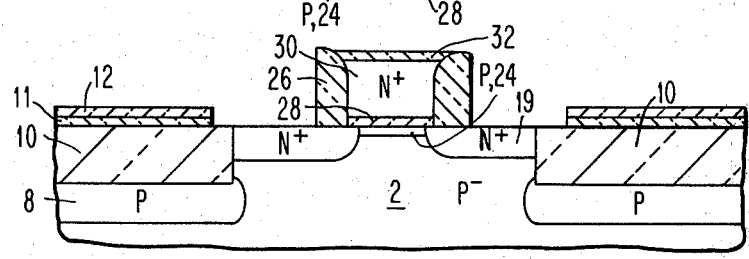

A second layer of N+ doped polycrystalline silicon 30 is formed by a procedure similar to that described above over the entire major surface of the structure, as shown in FIG. 7. The N+ doping may be done in situ or by phosphorus ion implantation following the polycrystalline silicon deposition. A photoresist or polyimide layer 31 is blanket deposited over the N+ polycrystalline silicon layer 30. The structure is placed in a reactive ion etching ambient which has a similar etch rate between the photoresist 31 chosen and the N+ polycrystalline silicon 30. The blanket reactive ion etching continues until the silicon nitride layer 20 is reached leaving the polycrystalline silicon 30 only in the designated gate electrode areas, as shown in FIG. 8. After forming patterns in polycrystalline silicon 30, silicon dioxide layer 32 of approximately 400 Angstroms in thickness is grown on the surface of the second polycrystalline silicon gate electrode areas 30 to produce the structure of FIG. 8. The silicon nitride layer 20 is removed by hot phosphoric acid $H_3PO_4$. The structure is placed in a reactive ion etching ambient for polycrystalline silicon to remove the remaining first polycrystalline silicon layer 18 and to produce the structure shown in FIG. 9. Using a non-critical mask, portions of the silicon dioxide 32 and 26 are removed in areas away from the FET areas.

Figure 10:
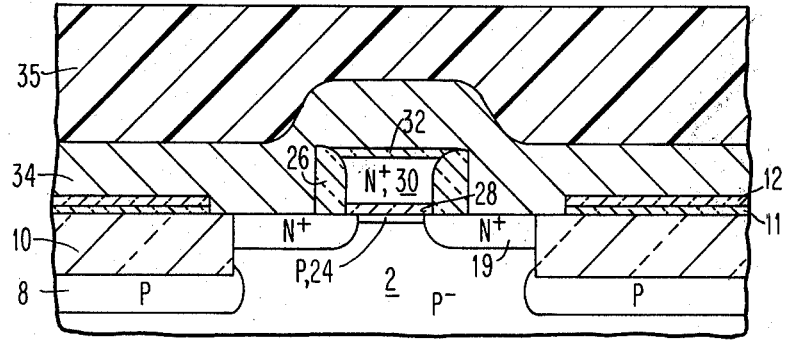

Using a suitable lift-off mask, a metal layer 34 is deposited over the narrow dimensioned dielectric regions 26, gate electrode regions 30, 32 and areas therebetween so that in the areas between the narrow dimensioned dielectric regions that have contact openings to the PN junction elements, such as source/drain regions 19 in the silicon body, the metal may ohmically contact such regions. The structure is substantially quite non-planar because the metal layer will form a hill like formation above the narrow dimensioned dielectric regions 26 and gate electrode regions 30, 32. The preferred metal layer is formed of aluminum-copper by evaporation or sputtering. Other metals which may be utilized as the blanket metal are aluminum, chromium/aluminum-copper. The non-planar blanket metallized structure is planarized by a blanket deposition of a plastic material 35 over the metal layer; this plastic material can be typically a photoresist or a polyimide material, or the like. The plastic material is spun on the surface of the wafer in known manner like 4500 rpm for 100 seconds. The polyimide is slow cured at 80° C. for 15 minutes and then at 300° C. for 20 minutes. The finalized structure is shown in FIG. 10. The planarized structure is placed in a reactive ion etching ambient. The etchback is typically performed in a $CCl_4/Ar$ ambient at 100 microns of Hg and 0.25 watts/cm$^2$. The reactive ion etching uniformly etches the plastic and the metal layer until the tops of the narrow dimensioned dielectric regions 26 are reached. The remaining plastic material is removed, for example, oxygen ashing or other suitable processes. The result of the process is a substantially planar structure of FIG. 11 wherein the source/drain metal contacts are 34 and the gate electrode is 30.

Figure 11:
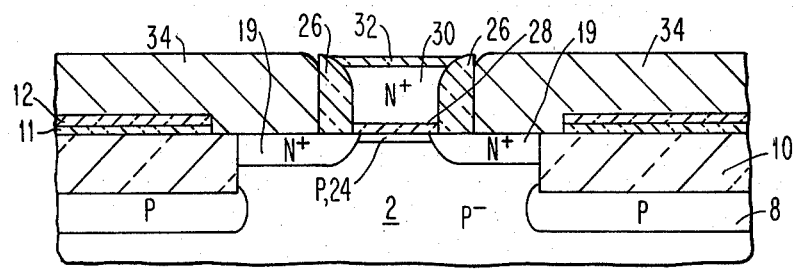
Figure 12:
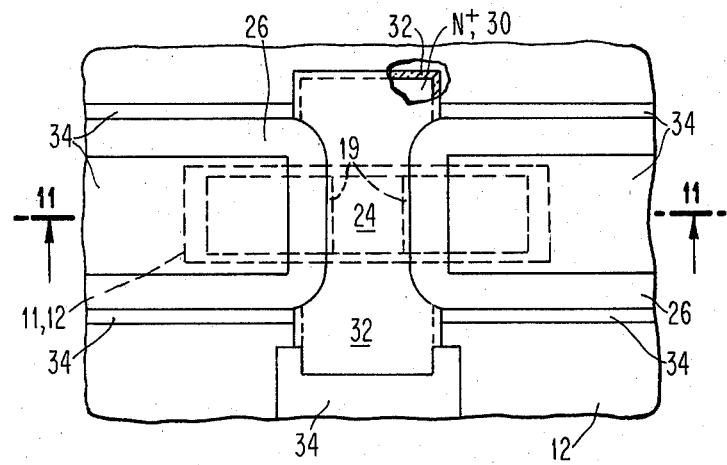
FIG. 12 shows the top view of the resulting structure made by the method of FIGS. 1–11.

The top view of the cross-sectional structure of FIG. 11 is shown in FIG. 12. FIG. 11 is a cross-section taken along 11:11 of FIG. 12. Whereas metal width and metal-to-metal separation determine the size of the device in previous techniques, here the device size is dictated mainly by the lithography of the silicon processes. Also, planar first level metal is achieved. Higher densities can be obtained for the same lithographic ground rules. In addition, 100 percent coverage of diffusions and gate regions is obtained. FIG. 12 shows a metal pattern contacting the N+ polycrystalline silicon pattern 30 at its sides. The metal contact is done in a region where the silicon dioxide layer 32 covering the polycrystalline silicon pattern 30 was removed earlier using a noncritical mask. Alternatively, the polycrystalline silicon patterns 32 can be contacted by a higher level metallization pattern through a contact hole in silicon dioxide 32.

Referring now more particularly to FIGS. 13 through 20, a second method embodiment is described. The process for forming the recessed dielectric isolation 10 on the surface regions of intrinsic silicon substrate 2 to isolate monocrystalline silicon regions designated to be sites for field effect transistor devices is formed according to the procedures described in relation to the FIG. 1 through FIG. 12 embodiment. Like numbers are indicative of like structures to the FIG. 1 through FIG. 12 embodiment.

Figure 13:
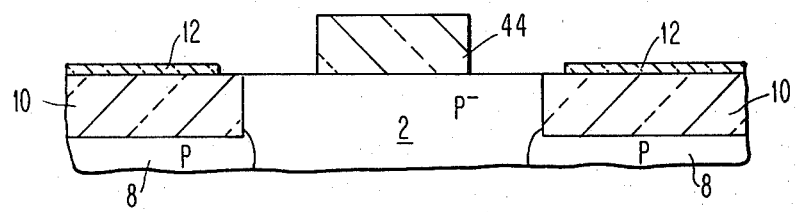
FIGS. 13 through 20 show a second method embodiment for forming a field effect transistor integrated circuit device according to the present invention.

A first insulating layer of silicon nitride 12 is deposited by chemical vapor deposition as described above. The thickness of the layer may be about 1500 Angstroms. Conventional lithography and etching is utilized to pattern the silicon nitride layer 12 so as to open all active device areas, as shown in FIG. 13. A silicon dioxide mask layer 44 is formed on the surface of the active semiconductor area by means of chemical vapor deposition of silicon dioxide followed by standard lithography and etching techniques to form the silicon dioxide mask 44, as shown in the FIG. 13. The preferred etching is by reactive ion etching to produce the substantially vertical sidewalls of the mask 44. The exposed silicon body 2 serves as the end point detector.

Figure 14:
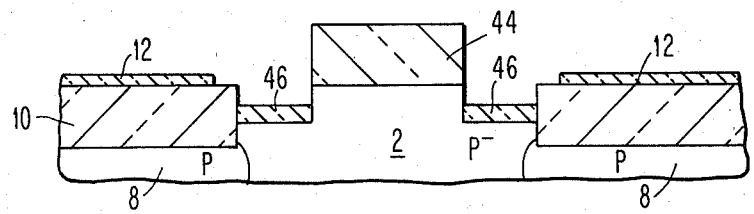

Referring now to FIG. 14, the process continues by reactive ion etching the silicon body 2 using the mask 44 in a reactive ion etching ambient to etch the silicon body about 0.8 micrometer in depth. Ion implantation of a suitable heavy dosage of oxygen at low energy is made into the exposed silicon surface using the silicon dioxide mask 44 and recessed oxide insulating regions 10 as the mask for the ion implantation step. The body is annealed at a temperature of between about 800° to 1000° C. to obtain the silicon dioxide layer 46. It should be noted that the ion implantation process is directional so that only the horizontal surfaces of the exposed silicon body 2 are affected by the ion implantation process. The vertical areas are not affected by the ion implantation process and remain silicon as shown in FIG. 14.

Figure 15:
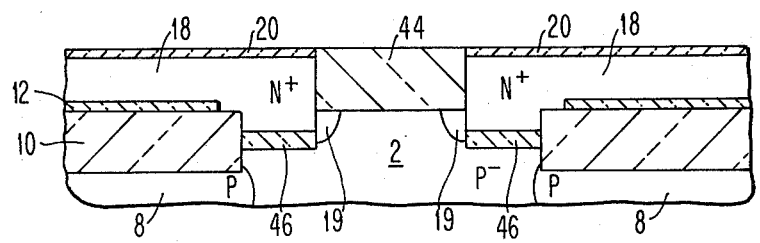

A N+ doped polycrystalline silicon layer 18 is deposited by chemical vapor deposition according to the processes described above. The polycrystalline silicon may be doped N+ by phosphorus ion implantation following the polycrystalline silicon deposition instead of an in situ doping process. A coating of photoresist or other suitable material (not shown) is applied so as to obtain a planar top surface. This coating material should have an etch rate in the ensuing reactive ion etching process which is equal to or slightly less than the polycrystalline silicon layer. Through the reactive ion etching process the coating material and the polycrystalline silicon protrusions are blanket etched to obtain the planar polycrystalline silicon patterns 18 separated by the silicon dioxide mask 44 as illustrated in FIG. 15. Any remaining photoresist may be removed by oxygen ashing. Ion implantation of a suitable dosage of nitrogen at low energy and annealing to a temperature of between about 1000° to 1200° C. will obtain the silicon nitride 20 on the polycrystalline silicon layer 18. The N+ source/drain regions 19 are formed by outdiffusion from the N+ polycrystalline silicon layer 18 through the vertical exposed regions of silicon body 2 during the above annealing heat cycle to produce the structure of FIG. 15.

Figure 16:
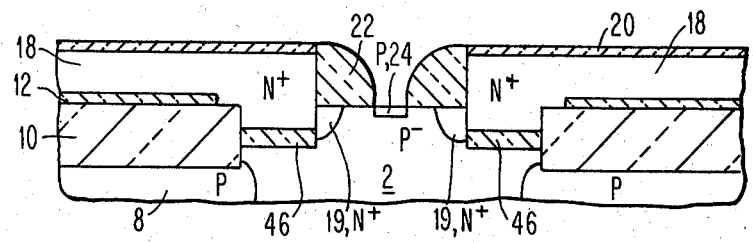

The mask 44 is removed by a suitable dipped chemical etching process. A conformal layer of silicon dioxide 22 of about 1 micrometer in thickness is deposited over the structure by a standard chemical vapor deposition process as described above. The structure is then put in a directional reactive ion etching ambient which acts to remove the horizontal layer of the first conformal insulating silicon dioxide coating 22 and to provide narrow openings to the exposed surface of the monocrystalline silicon surface region of body 2 between the vertical surfaces of the insulating coating. An ion implantation of a suitable dosage of boron at low energy is made to obtain the P "short-channel" region 24 at the exposed silicon surface, as shown in FIG. 16.

Figure 17:
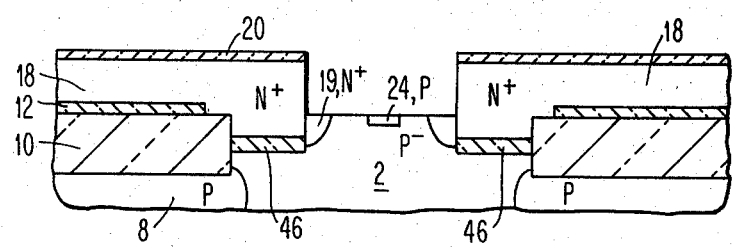
Figure 18:
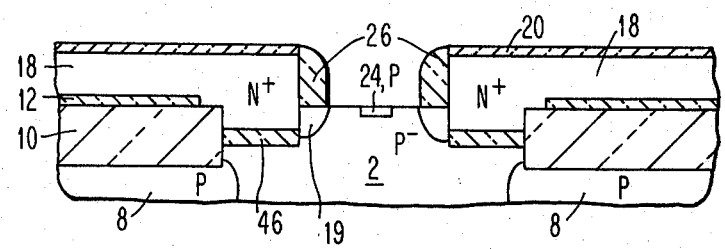
Figure 19:
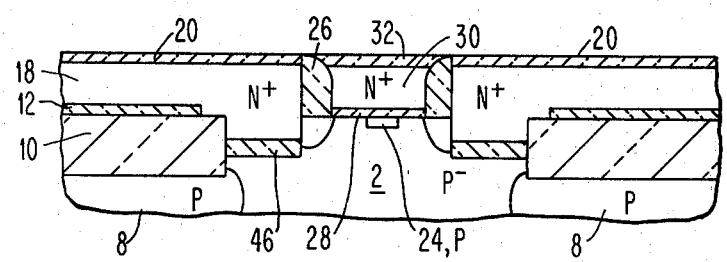

The silicon dioxide mask 22 is removed by standard dipped chemical etching to obtain the structure of FIG. 17. A second conformal coating 26 is deposited on both the substantially vertical and substantially horizontal surfaces. The thickness of the coating may be of the order of 0.5 micrometers. Directional reactive ion etching is now utilized to substantially remove the horizontal layer and to provide a pattern of narrow dimensioned dielectric regions 26 on the silicon body to produce the structure shown in FIG. 18.

The exposed surface of the monocrystalline silicon body 2 is thermally oxidized between certain of the narrow dimensioned regions to form the gate dielectric regions for the integrated circuit. The gate dielectric oxide is preferably about 400 Angstroms in thickness. A second layer of N+ doped polycrystalline silicon 30 is deposited by chemical vapor deposition as described above. Also as described above, the N+ doping may be incorporated into the polycrystalline silicon layer in situ or by an after deposition ion implantation of phosphorus into the layer. The structure is planarized using the photoresist or similar material and reactive ion etching procedure described above in relation to the first layer of polycrystalline silicon 18 planarization. The result of this process is a planar structure with polycrystalline silicon layer 30 formed as the gate electrode in the planar structure of FIG. 19. After forming patterns in the polycrystalline silicon 30, the surface of the layer 30 is exposed to a thermal oxidizing ambient to grow about a 400 Angstrom silicon dioxide layer 32 which results in the structure of FIG. 19.

Figure 20:
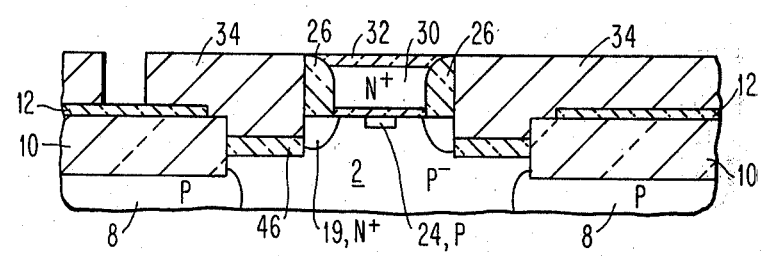

Referring now to FIG. 20, the silicon nitride layer 20 is removed by a conventional wet-etching process. The remaining first polycrystalline silicon layer 18 is removed by a reactive ion etching process. Using a noncritical mask, portions of silicon dioxide 32 and layer 26 are removed in areas away from the FET areas. The process then continues to form a layer of about 1.6 micrometers of aluminum/copper layer 34. A lift-off masking technique, such as described by J. R. Franco, et al, U.S. Pat. No. 4,004,044, may be utilized to remove the aluminum/copper layer 34 in regions where it is not desired. The planarization process is repeated as described in regard to the FIG. 1 through 12 first embodiment process to produce the final structure of FIG. 20. The identical top view shown in FIG. 12 will be the result of the process of the second embodiment resulting in the vertical structure of FIG. 20.

The length of the P "short-channel" region 24 can easily be made of any desired submicron dimension, such as for example, 0.5 micrometers, while even using a 2.5 micrometer photolithography ground rule. It is important to recognize that unlike a conventional DMOS, double-diffused metal oxide semiconductor, the field effect transistor of FIG. 20 is bilateral or symmetrical, in that the source and drain can interchange their roles readily during circuit operation. The overlap capacitance of the gate electrode over the source/drain is near zero. The parasitic capacitance of the source/drain to substrate is diminished by the introduction of the dielectric layer of silicon dioxide 46. The only region for this tiny capacitance is the approximately 0.6 micrometer lateral N+ diffusion 19.

While the invention has been particularly shown and described with reference to the preferred embodiments thereof, it will be understood by those skilled in the art that various changes in form and details may be made therein without departing from the spirit and scope of the invention.

I claim:

1. A method of forming a short-channel field effect transistor integrated circuit comprising:
   providing a silicon body having monocrystalline silicon regions dielectrically isolated from similar regions at a major surface of said body;
   providing a substantially vertically sided silicon dioxide mask located over the said major surface of at least some of said monocrystalline silicon regions;
   reactively ion etching the exposed said monocrystalline silicon to a depth of between about 0.4 to 1.5 micrometers;
   ion implanting a dosage of oxygen into the exposed said monocrystalline silicon at low energy and annealing the structure to form a silicon dioxide layer covering the horizontal said exposed monocrystalline silicon regions while allowing the vertically exposed said monocrystalline silicon to remain exposed;
   forming on said major surface of said silicon body a doped polycrystalline silicon layer substantially the same thickness as said silicon dioxide mask and in all areas other than the locations of said silicon dioxide mask;
   ion implanting a dosage of nitrogen at low energy and annealing the structure to form a silicon nitride layer covering said doped polycrystalline silicon layer;
   heating the structure to diffuse impurities through said vertically exposed monocrystalline silicon to form PN junctions therein;
   etching away said silicon dioxide mask to provide substantially vertical and substantially horizontal surfaces on the structure and with openings to the surface of said monocrystalline silicon regions;

depositing a first conformal insulating coating on both said substantially vertical and substantially horizontal surfaces;

reactive ion etching said first conformal insulating coating to substantially remove said first conformal coating from said horizontal surfaces and to provide narrowed said openings therebetween due to presence of said insulating coating on the vertical surfaces of said monocrystalline silicon regions;

forming a short-channel region through said narrowed openings;

etching away said first conformal insulating coating on the vertical surfaces;

depositing a second conformal insulating coating on both said substantially vertical and substantially horizontal surfaces;

reactive ion etching said second conformal coating to substantially remove said second conformal coating from said horizontal surfaces and to provide narrow dimensioned dielectric regions on said silicon body;

thermally oxidizing the surface of said monocrystalline silicon between certain of said narrow dimensioned regions to form the gate dielectric regions for said integrated circuit;

forming a highly doped second polycrystalline silicon layer on the designated said gate dielectric regions for said field effect transistor integrated circuits wherein said layer is the gate electrode for said circuits;

removing the remaining said first polycrystalline silicon layer by reactive ion etching to leave the said narrow dimensioned regions and said second polycrystalline silicon layer on said gate dielectric on said silicon body; and forming a conductive layer on said silicon body which has portions thereof electrically separated by said narrow dimensioned regions for contacting the said source/drain regions.

2. The method of claim 1 wherein said polycrystalline gate electrode is electrically contacted on its edge by a conductive layer of the same material and formed at the same time as said conductive layer for contacting said source/drain regions.

3. The method of claim 1 wherein said polycrystalline silicon gate electrode is electrically contacted by a higher level metal electrical contact form above.

4. The method of claim 2 wherein the said conductive layer is composed of aluminum and said polycrystalline silicon is N type.

5. The method of claim 1 wherein the said forming a second polycrystalline layer includes blanket depositing a plastic material over the said second polycrystalline layer to planarize the surface, reactive ion etching the plastic material and said second polycrystalline silicon layer until said silicon nitride layer is reached, removing the remaining plastic by oxygen ashing and oxidizing the surface of the remaining said second polycrystalline silicon gate electrode to form a silicon dioxide layer thereover.

6. The method of claim 5 wherein portions of said narrow dimensioned regions and portions of said silicon dioxide on the surface of said second polycrystalline silicon layer are removed so that portions of said conductive layer can make electrical contact to said gate electrode.

7. The method of claim 1 wherein the said forming a conductive layer includes depositing a layer of aluminum over said narrow dimensioned regions and areas in between, blanket depositing a plastic material over the said aluminum layer to planarize the surface, reactive ion etching the said plastic material and said aluminum layer until the tops of said narrow dimensioned regions are reached and removing the remaining said plastic material.

8. The method of claim 1 wherein said conductive layer is patterned in certain regions by a photolithographic technique.

* * * * *